(12) United States Patent
Miyazaki et al.

(10) Patent No.: US 8,773,176 B2
(45) Date of Patent: Jul. 8, 2014

(54) DRIVING METHOD AND DRIVING CIRCUIT OF SCHOTTKY TYPE TRANSISTOR

(71) Applicant: Transphorm Japan, Inc., Yokohama (JP)

(72) Inventors: Yasumori Miyazaki, Akiruno (JP); Yoshihiro Takemae, Minato (JP)

(73) Assignee: Transphorm Japan Inc., Yokohama (JP)

( * ) Notice: Subject to any disclaimer, the term of this patent is extended or adjusted under 35 U.S.C. 154(b) by 0 days.

(21) Appl. No.: 13/730,480

(22) Filed: Dec. 28, 2012

(65) Prior Publication Data
US 2013/0194025 A1    Aug. 1, 2013

(30) Foreign Application Priority Data
Jan. 31, 2012  (JP) .................................. 2012-17486

(51) Int. Cl.
*H03K 3/00*  (2006.01)

(52) U.S. Cl.
USPC .............................. 327/108; 327/112; 326/68

(58) Field of Classification Search
USPC ............................... 327/108, 112; 326/68, 75
See application file for complete search history.

(56) References Cited

U.S. PATENT DOCUMENTS

| | | | |
|---|---|---|---|
| 6,400,203 B1 * | 6/2002 | Bezzi et al. .................... | 327/309 |
| 6,552,596 B2 * | 4/2003 | Cowles et al. ................. | 327/318 |
| 7,031,129 B2 * | 4/2006 | Mayama et al. .............. | 361/91.1 |
| 7,129,759 B2 * | 10/2006 | Fukami ......................... | 327/110 |
| 7,310,006 B2 * | 12/2007 | Shimada ........................ | 326/83 |

FOREIGN PATENT DOCUMENTS

JP            10-284990 A       10/1998

* cited by examiner

*Primary Examiner* — Kenneth B. Wells
(74) *Attorney, Agent, or Firm* — Fish & Richardson P.C.

(57) ABSTRACT

A driving circuit of a schottky type transistor includes an input terminal supplied with an input signal, and an output terminal connected to a gate of the schottky type transistor. The driving circuit outputs a first voltage lower than a breakdown voltage of the schottky type transistor to the output terminal at the time of rising of the input signal, and thereafter supplies a second voltage higher than the breakdown voltage to a resistance connected to the output terminal.

14 Claims, 8 Drawing Sheets

US 8,773,176 B2

DRIVING METHOD AND DRIVING CIRCUIT OF SCHOTTKY TYPE TRANSISTOR

CROSS-REFERENCE TO RELATED APPLICATION

This application is based upon and claims the benefit of priority of the prior Japanese Patent Application No. 2012-17486, filed on Jan. 31, 2012, the entire contents of which are incorporated herein by reference.

FIELD

The embodiments discussed herein are related to a driving method and a driving circuit of a schottky type transistor.

BACKGROUND

A schottky type GaN (gallium nitride) transistor as a type of HEMT (High Electron Mobility Transistor) is used for a switching circuit configured to perform switching at high speed, a power supply circuit, or the like, because of being capable of high-output-power and high-speed operation.
[Patent Document 1] Japanese Laid-open Patent Publication No. 10-284990.

SUMMARY

According to one aspect of the disclosed techniques, a driving method of a schottky type transistor includes: supplying a lower voltage than a breakdown voltage of the schottky type transistor to a gate of the schottky type transistor at the time of rising of an input signal; and thereafter supplying a higher voltage than the breakdown voltage to a resistance connected to the gate of the schottky type transistor.

According to another aspect of the disclosed techniques, a driving circuit of a schottky type transistor includes: an input terminal supplied with an input signal; an output terminal connected to a gate of the schottky type transistor; and an electronic circuit provided between the input terminal and the output terminal, wherein the electronic circuit outputs a first voltage lower than a breakdown voltage of the schottky type transistor to the output terminal at the time of rising of the input signal, and thereafter supplies a second voltage higher than the breakdown voltage to a resistance connected to the output terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinbelow, description will be given with regard to a prelude for facilitating an understanding of embodiments, prior to description of the embodiments.

Figure 1:
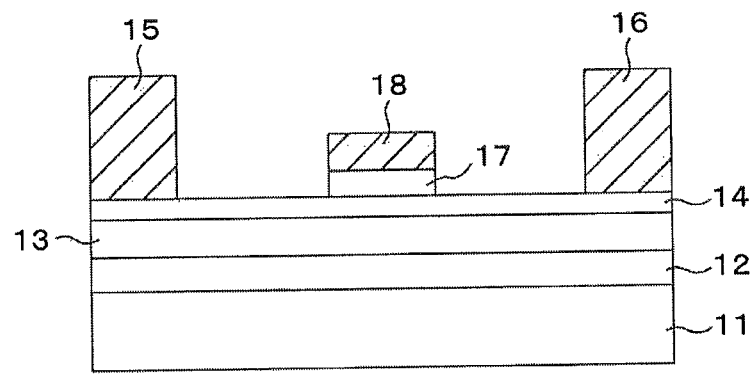
FIG. 1 is a cross-sectional view illustrating an example of a schottky type GaN transistor.

FIG. 1 is a cross-sectional view illustrating an example of a schottky type GaN transistor.

The schottky type GaN transistor illustrated in FIG. 1 includes a substrate 11, a buffer layer 12 formed on the substrate 11, an electron transit layer 13 formed on the buffer layer 12, and an electron supply layer 14 formed on the electron transit layer 13.

A source electrode 15 and a drain electrode 16 are formed in isolation from each other on the electron supply layer 14, and a control layer 17 and a gate electrode 18 are stacked on the electron supply layer 14 between the source electrode 15 and the drain electrode 16.

In the schottky type GaN transistor, a silicon (Si) substrate, for example, may be used as the substrate 11. The buffer layer 12 is formed for example by laminating AlN (aluminum nitride) and GaN. Also, the electron transit layer 13 is formed by undoped GaN, and the electron supply layer 14 is formed by AlGaN (aluminum gallium nitride). Further, the control layer 17 is formed by p type GaN, and the source electrode 15, the drain electrode 16 and the gate electrode 18 are formed by metal such for example as Ni (nickel), Ti (titanium), Al (aluminum), Pt (platinum) or Au (gold).

Figure 2:
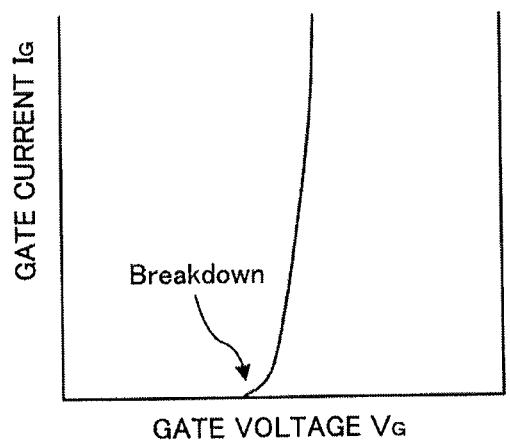
FIG. 2 is a graph illustrating leakage current characteristics of the schottky type GaN transistor.

FIG. 2 is a graph illustrating leakage current characteristics of the schottky type GaN transistor (hereinafter referred to simply as a "GaN transistor"), on which the abscissa axis represents gate voltage VG and the ordinate axis represents gate current $I_G$.

In the GaN transistor, it is desirable that the gate voltage $V_G$ be set as high as possible in order to reduce on-state resistance. However, as illustrated in FIG. 2, when the gate voltage $V_G$ exceeds a certain voltage, there is an increase in the gate current $I_G$ (hereinafter sometimes called "leakage current") flowing from the gate to the source. The voltage at which the gate current $I_G$ starts increasing is called breakdown voltage.

In the GaN transistor, there are relatively great variations in the breakdown voltage; for example, some transistors have a breakdown voltage of 8.0 V, while others have a breakdown voltage of 7.8 V. Therefore, the gate voltage of the GaN transistor is set somewhat lower, allowing for a margin.

However, when the gate voltage is set somewhat lower, the schottky type GaN transistor is driven with high on-state resistance, and drive capability to drive the schottky type GaN transistor is not fully drawn out. Also, due to the drive operation with the high on-state resistance, a great deal of heat is produced, thus causing waste of power consumption.

With reference to the following embodiments, description will be given with regard to a driving circuit and a driving method of a schottky type transistor, which may be capable of drawing out sufficient drive capability irrespective of variations in breakdown voltage.

First Embodiment

A first embodiment will be described below with reference to the accompanying drawings.

Figure 3:
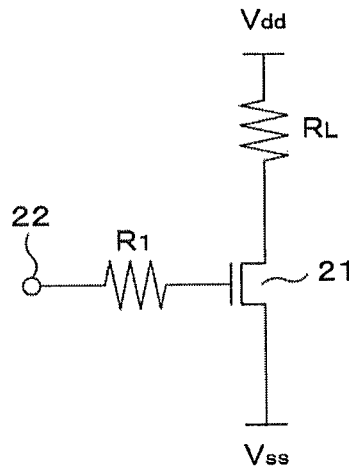
FIG. 3 is a diagram of assistance in explaining a driving method of a schottky type transistor according to a first embodiment.

When a resistance R1 is connected between a gate of a GaN transistor 21 and an input terminal (or a node) 22 as illustrated in FIG. 3, a large leakage current, at the occurrence of a breakdown, flows through the resistance R1 and hence causes a voltage drop according to the leakage current. Thus, when the breakdown occurs, a voltage applied to the gate becomes lower than a voltage supplied to the input terminal 22. Incidentally, a resistance $R_L$ in FIG. 3 is a diagrammatic representation of a load connected to the GaN transistor 21.

For example, it is assumed that a GaN transistor having a breakdown voltage of 7.8 V and a GaN transistor having a breakdown voltage of 8.0 V are each used as the GaN transistor 21 of FIG. 3.

When a voltage of 7.8 V inclusive to 8 V exclusive is applied to the input terminal 22, a breakdown occurs in the GaN transistor having a breakdown voltage of 7.8 V, and thus, a large amount of leakage current flows through the resistance R1. As a result, the gate voltage decreases by a voltage drop effected by the resistance R1, so that the breakdown is suppressed.

On the other hand, even when a voltage of less than 8.0 V is applied to the input terminal 22, a breakdown does not occur in the GaN transistor having a breakdown voltage of 8.0 V, and thus, the voltage of the gate becomes equal to the voltage of the input terminal 22.

In other words, the connection of the resistance R1 between the input terminal 22 and the gate of the GaN transistor 21 achieves the same effect as that obtained by reducing variations in the breakdown voltage of the GaN transistor 21.

A resistance value of the resistance R1 may be set so that, when the breakdown voltage is supplied to the input terminal 22, the voltage applied to the gate becomes slightly lower than the breakdown voltage. For example, the resistance value of the resistance R1 may be set equal to or more than a value calculated by Equation (1):

$$R1 = (V_{G1} - V_{G2})/I_G \qquad (1)$$

where $V_{G1}$ denotes a maximum value of voltage supplied to the resistance R1; $V_{G2}$ denotes the breakdown voltage of the GaN transistor 21; and $I_G$ denotes the current flowing through the gate at the occurrence of a breakdown, and $V_{G1}$ is more than $V_{G2}$ ($V_{G1} > V_{G2}$).

Incidentally, when the resistance R1 is connected between the input terminal 22 and the gate of the GaN transistor 21, the resistance R1 acts as a load to delay the rising of a signal, hence causing a delay in switching operation.

Figure 4:
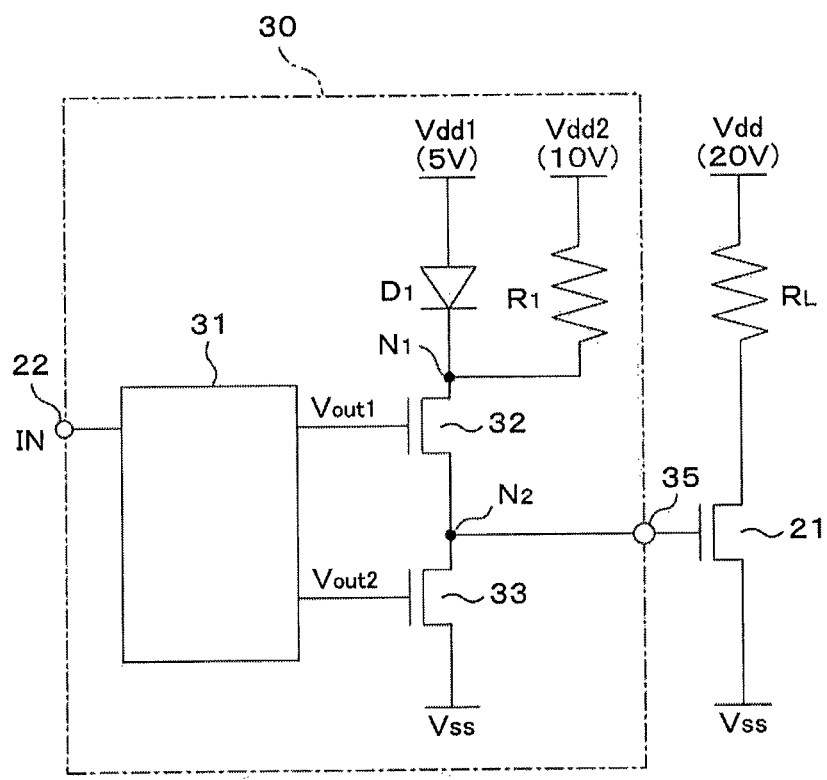
FIG. 4 is a diagram illustrating a driving circuit of a schottky type transistor according to the first embodiment.

FIG. 4 is a diagram illustrating a driving circuit of a schottky type transistor which avoids the delay in the switching operation.

A driving circuit 30 of a schottky type transistor illustrated in FIG. 4 includes a driving signal generator 31, MOS transistors 32, 33, a diode D1, and the resistance R1. The input terminal 22 is connected to an input of the driving signal generator 31, and the driving signal generator 31 outputs a first driving signal Vout1 and a second driving signal Vout2. The first driving signal Vout1 is fed to a gate of the MOS transistor 32, and the second driving signal Vout2 is fed to a gate of the MOS transistor 33.

The MOS transistors 32, 33 are connected in series between a node N1 and a low-potential power supply line Vss. Also, a node N2 between the MOS transistor 32 and the MOS transistor 33 is connected via an output terminal 35 to the gate of the GaN transistor 21.

An anode of the diode D1 is connected to a high-potential power supply line Vdd1, and a cathode of the diode D1 is connected to the node N1. Also, the resistance R1 is connected between a high-potential power supply line Vdd2 and the node N1.

A voltage of the high-potential power supply line Vdd1 is set slightly lower than the breakdown voltage of the GaN transistor 21, and a voltage of the high-potential power supply line Vdd2 is set higher than the breakdown voltage of the GaN transistor 21. Here, the breakdown voltage of the GaN transistor 21 is set to 8 V; the voltage of the high-potential power supply line Vdd1 is set to 5 V; and the voltage of the high-potential power supply line Vdd2 is set to 10 V.

Meanwhile, the source of the GaN transistor 21 is connected to the low-potential power supply line Vss, and the load $R_L$ is connected between the drain of the GaN transistor 21 and a high-potential power supply line Vdd. A voltage of the high-potential power supply line Vdd is 20 V, for example.

Figure 5:
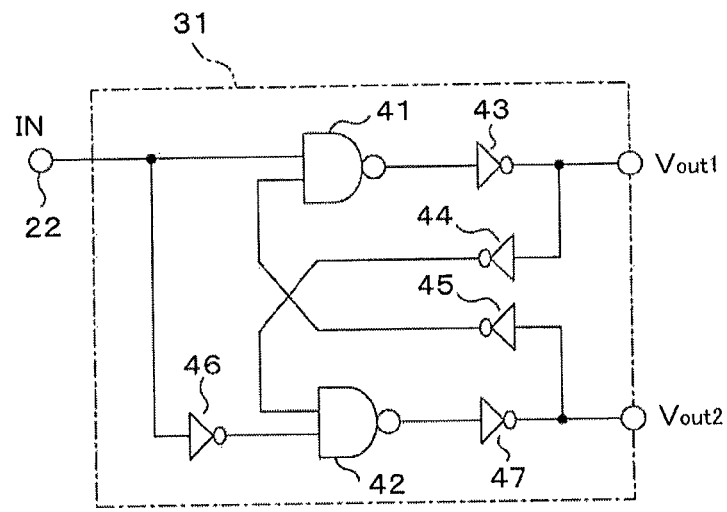
FIG. 5 is a diagram illustrating a specific example of a circuit of a driving signal generator of the driving circuit of the schottky type transistor according to the first embodiment.

FIG. 5 is a diagram illustrating a specific example of a circuit of the driving signal generator 31.

The driving signal generator 31 illustrated in FIG. 5 includes two NAND circuits 41, 42 and five inverters 43 to 47. When a signal IN is inputted to the input terminal 22, the driving signal generator 31 outputs the first driving signal Vout1 in phase with the signal IN, and the second driving signal Vout2 as an inverted signal of the first driving signal Vout1.

Figure 6:
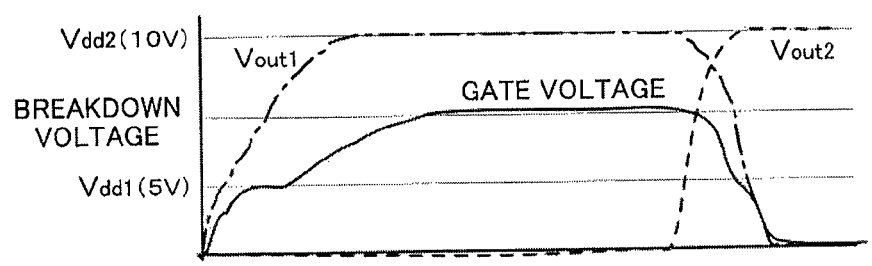
FIG. 6 is a graph illustrating changes in a first driving signal Vout1, a second driving signal Vout2 and a gate voltage of a GaN transistor.

FIG. 6 is a graph illustrating changes in the first driving signal Vout1, the second driving signal Vout2 and the gate voltage of the GaN transistor, on which the abscissa axis represents time and the ordinate axis represents voltage. Operation of the driving circuit illustrated in FIG. 4 will be described with reference to FIG. 6.

When the signal IN is fed to the input terminal 22 and a voltage of the first driving signal Vout1 outputted from the driving signal generator 31 exceeds a threshold voltage (e.g. 1 V) of the MOS transistor 33, the MOS transistor 32 is turned on, and the MOS transistor 33 is turned off. Thereby, a current flows from the high-potential power supply line Vdd1 through the diode D1 and the MOS transistor 32 to the gate of the GaN transistor 21, thus increasing the gate voltage of the GaN transistor 21.

Then, when the gate voltage exceeds a threshold voltage (e.g. 1 to 2 V) of the GaN transistor 21, the GaN transistor 21 is turned on. In this case, both the diode D1 and the MOS transistor 32 between the high-potential power supply line Vdd1 and the gate of the GaN transistor 21 are in on-state, and thus, resistance is low in a path from the power supply line Vdd1 to the diode D1, the MOS transistor 32 and the GaN transistor 21, the GaN transistor 21 is turned on substantially simultaneously with the rising of the signal IN, and there is little delay in the switching operation.

After that, when a voltage of the node N1 becomes 5 V, the diode D1 is turned off. However, the node N1 is connected via the resistance R1 to the high-potential power supply line Vdd2, and thus, a current flows from the high-potential power supply line Vdd2 through the resistance R1 and the MOS transistor 32 to the gate of the GaN transistor 21. This leads to a further increase in the gate voltage of the GaN transistor 21.

Then, when the gate voltage of the GaN transistor 21 reaches the breakdown voltage, the GaN transistor 21 undergoes a breakdown. However, as described with reference to FIG. 3, when the GaN transistor 21 undergoes the breakdown, a large current flows through the resistance R1, and the gate voltage of the GaN transistor 21 decreases by the voltage drop effected by the resistance R1, so that the breakdown is suppressed. As a result, the drive capability to drive the GaN transistor 21 may be fully drawn out irrespective of variations in the breakdown voltage of the GaN transistor 21.

Meanwhile, when the voltage applied to the input terminal 22 becomes 0 V, the MOS transistor 32 is turned off, and the MOS transistor 33 is turned on. Thus, the gate voltage of the GaN transistor 21 becomes equal to a voltage (0 V) of the low-potential power supply line Vss, and the GaN transistor 21 is turned off.

In the first embodiment, as described above, at an early period of the rising of the signal IN, the current flows from the high-potential power supply line Vdd1 through the diode D1 to the gate of the GaN transistor 21, thus increasing the gate voltage of the GaN transistor 21. At this time, the resistance is low between the power supply line Vdd1 and the gate of the GaN transistor 21 and thus a signal delay is avoided, so that high-speed switching may be possible.

Also, when the gate voltage of the GaN transistor 21 increases to a certain or greater extent, the diode D1 is turned off, and the current flows from the high-potential power supply line Vdd2 through the resistance R1 to the gate of the GaN transistor 21. Under this condition, when the GaN transistor 21 undergoes a breakdown, a voltage drop occurs in the resistance R1, and the gate voltage decreases by the voltage drop in the resistance R1, so that the breakdown is suppressed. Thereby, the drive capability to drive the GaN transistor 21 may be fully drawn out irrespective of variations in the breakdown voltage of the GaN transistor 21.

Second Embodiment

Figure 7:
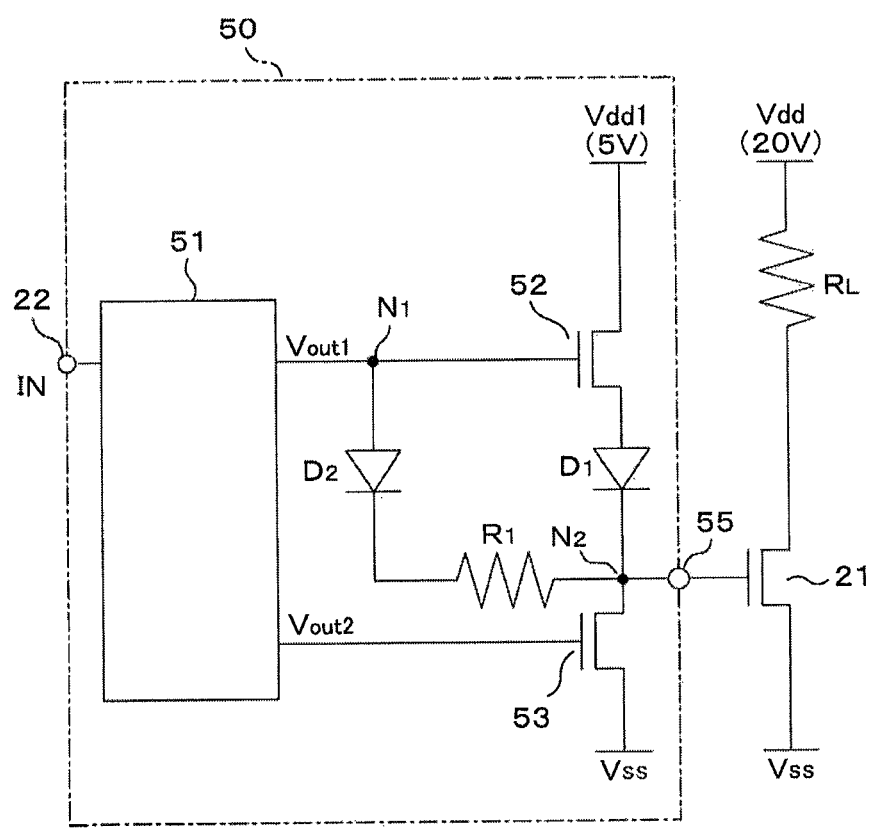
FIG. 7 is a diagram illustrating a driving circuit of a schottky type transistor according to a second embodiment.

FIG. 7 is a diagram illustrating a driving circuit of a schottky type transistor according to a second embodiment.

As illustrated in FIG. 7, a driving circuit 50 of a schottky type transistor according to the second embodiment includes a driving signal generator 51, MOS transistors 52, 53, diodes D1, D2, and the resistance R1.

The input terminal 22 is connected to an input of the driving signal generator 51, and the driving signal generator 51 outputs the first driving signal Vout1 and the second driving signal Vout2. The first driving signal Vout1 is fed through the node N1 to a gate of the MOS transistor 52, and the second driving signal Vout2 is fed to a gate of the MOS transistor 53.

The diode D2 and the resistance R1 are connected in series between the node N1 and the node N2. The MOS transistor 53 is connected between the node N2 and the low-potential power supply line Vss, and the MOS transistor 52 and the diode D1 are connected in series between the high-potential power supply line Vdd1 and the node N2.

The node N2 is connected to an output terminal 55, and the output terminal 55 is connected to the gate of the GaN transistor 21.

The diode D2 is connected at its anode to the node N1 and at its cathode to the resistance R1. Also, the diode D1 is connected at its anode to the MOS transistor 52 and at its cathode to the node N2.

Meanwhile, the source of the GaN transistor 21 is connected to the low-potential power supply line Vss, and the load $R_L$ is connected between the drain of the GaN transistor 21 and the high-potential power supply line Vdd. In the second embodiment, the voltage of the high-potential power supply line Vdd1 is set to 5 V, and the voltage of the high-potential power supply line Vdd is set to 20 V.

Figure 8:
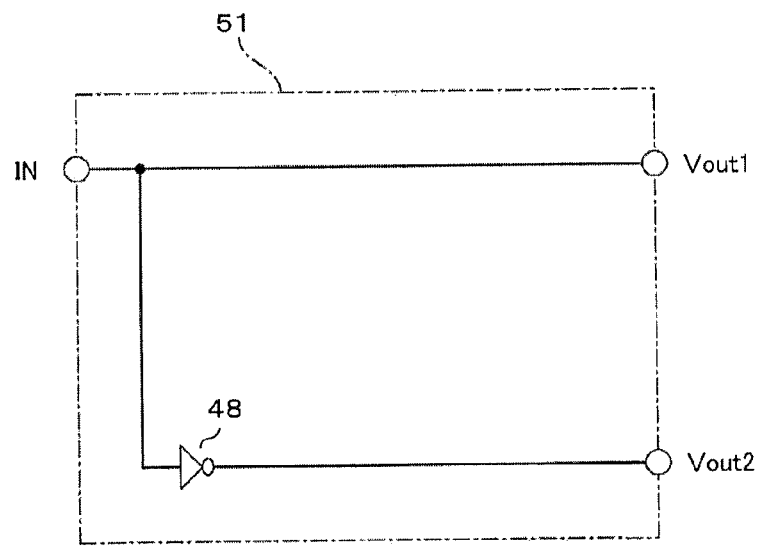
FIG. 8 is a diagram illustrating a specific example of a circuit of a driving signal generator of the driving circuit of the schottky type transistor according to the second embodiment.

FIG. 8 is a diagram illustrating a specific example of a circuit of the driving signal generator 51.

The driving signal generator 51 outputs the signal IN as the first driving signal Vout1, directly or through a buffer or the like. Also, a signal obtained by an inverter 48 inverting the signal IN is outputted as the second driving signal Vout2.

Figure 9:
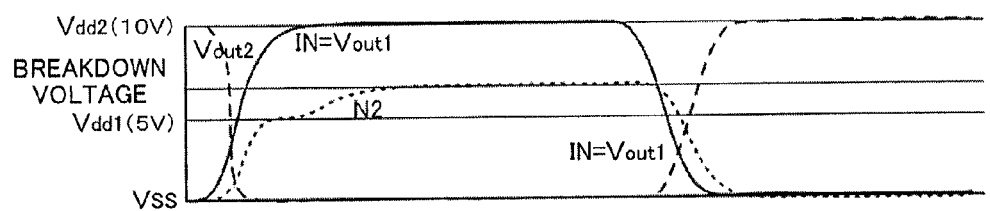
FIG. 9 is a graph illustrating changes in the first driving signal Vout1, the second driving signal Vout2 and the gate voltage of the GaN transistor.

FIG. 9 is a graph illustrating changes in the first driving signal Vout1, the second driving signal Vout2 and the gate voltage of the GaN transistor (or a voltage of the node N2), on which the abscissa axis represents time and the ordinate axis represents voltage. Operation of the driving circuit 50 illustrated in FIG. 7 will be described with reference to FIG. 9.

When the signal IN is inputted and the voltage of the input terminal 22 exceeds a threshold voltage (e.g. 1 V) of the MOS transistor 52, the MOS transistor 52 is turned on, and the MOS transistor 53 is turned off. Thereby, a current flows from the high-potential power supply line Vdd1 through the MOS transistor 52, the diode D1 and the node N2 to the gate of the GaN transistor 21, thus increasing the gate voltage of the GaN transistor 21.

Then, when the gate voltage exceeds the threshold voltage (e.g. 1 to 2 V) of the GaN transistor 21, the GaN transistor 21 is turned on. In this case, the diode D1 and the MOS transistor 52 are in on-state, and thus, resistance is low in a path from the power supply line Vdd1 to the GaN transistor 21, the GaN transistor 21 is turned on substantially simultaneously with the rising of the signal IN, and there is little delay in the switching operation.

After that, when the voltage of the node N2 becomes 5 V, the diode D1 is turned off. However, when a voltage of the signal IN exceeds 5 V, a current flows from the node N1 through the diode D2 and the resistance R1 to the node N2, thus causing a further increase in the gate voltage of the GaN transistor 21.

Then, when the gate voltage of the GaN transistor 21 reaches the breakdown voltage, the GaN transistor 21 undergoes a breakdown. However, as described with reference to FIG. 3, when the GaN transistor 21 undergoes the breakdown, a large current flows through the resistance R1, and the gate voltage of the GaN transistor 21 decreases by the voltage drop effected by the resistance R1, so that the breakdown is suppressed.

As a result, the drive capability to drive the GaN transistor 21 may be fully drawn out irrespective of variations in the breakdown voltage of the GaN transistor 21.

Meanwhile, when the voltage applied to the input terminal 22 becomes 0 V, the MOS transistor 52 is turned off, and the MOS transistor 53 is turned on. Thus, the gate voltage of the GaN transistor 21 becomes equal to the voltage (0 V) of the low-potential power supply line Vss, and the GaN transistor 21 is turned off.

Also in the second embodiment, the drive capability to drive the GaN transistor 21 may be fully drawn out irrespective of variations in the breakdown voltage, as is the case with the first embodiment. The second embodiment also has the advantage of enabling a simplification of the power supply as compared to the first embodiment, because of using only two lines of 5 V and 20 V as the high-potential power supply lines.

Third Embodiment

Figure 10:
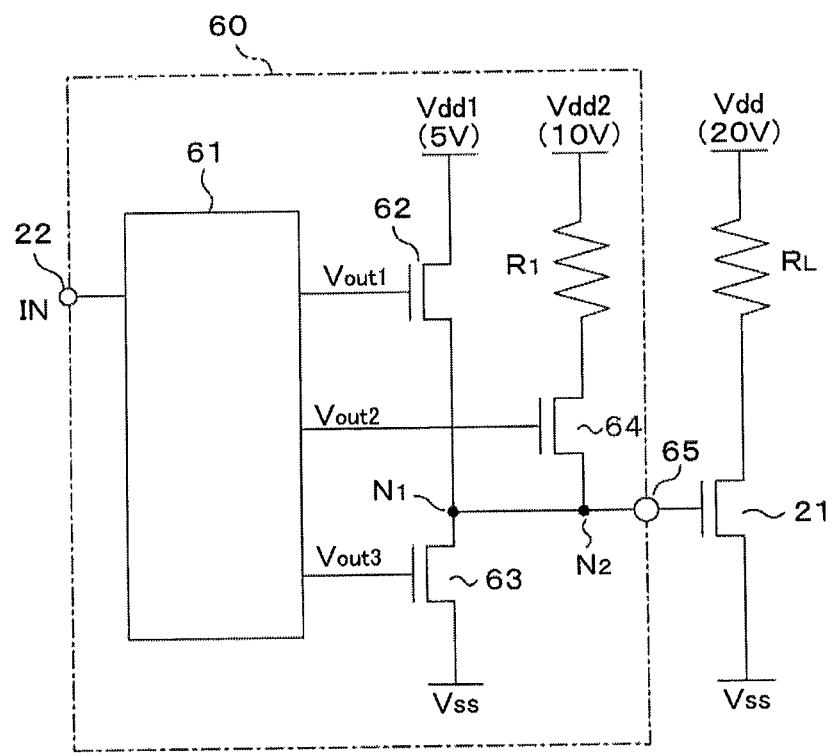
FIG. 10 is a diagram illustrating a driving circuit of a schottky type transistor according to a third embodiment.

FIG. 10 is a diagram illustrating a driving circuit of a schottky type transistor according to a third embodiment.

As illustrated in FIG. 10, a driving circuit 60 of a schottky type transistor according to the third embodiment includes a driving signal generator 61, MOS transistors 62, 63, 64, and the resistance R1.

The input terminal 22 is connected to an input of the driving signal generator 61, and the driving signal generator 61 outputs the first driving signal Vout1, the second driving signal Vout2 and a third driving signal Vout3. The first driving signal Vout1 is fed to a gate of the MOS transistor 62, the second driving signal Vout2 is fed to a gate of the MOS transistor 64, and the third driving signal Vout3 is fed to a gate of the MOS transistor 63.

The MOS transistors 62, 63 are connected in series between the high-potential power supply line Vdd1 and the low-potential power supply line Vss, and the node N1 between the MOS transistors 62, 63 is connected via the node N2 and an output terminal 65 to the gate of the GaN transistor 21.

Also, the resistance R1 and the MOS transistor 64 are connected in series between the high-potential power supply line Vdd2 and the node N2. Incidentally, in FIG. 10, the resistance R1 is connected between the high-potential power supply line Vdd2 and the MOS transistor 64; however, the resistance R1 may be connected between the MOS transistor 64 and the node N2.

The voltage of the high-potential power supply line Vdd1 is set slightly lower than the breakdown voltage of the GaN transistor 21, and the voltage of the high-potential power supply line Vdd2 is set higher than the breakdown voltage of the GaN transistor 21. Here, the voltage of the high-potential power supply line Vdd1 is set to 5 V, and the voltage of the high-potential power supply line Vdd2 is set to 10 V.

Meanwhile, the source of the GaN transistor 21 is connected to the low-potential power supply line Vss, and the load $R_L$ is connected between the drain of the GaN transistor 21 and the high-potential power supply line Vdd. The voltage of the high-potential power supply line Vdd is 20 V, for example.

Figure 11:
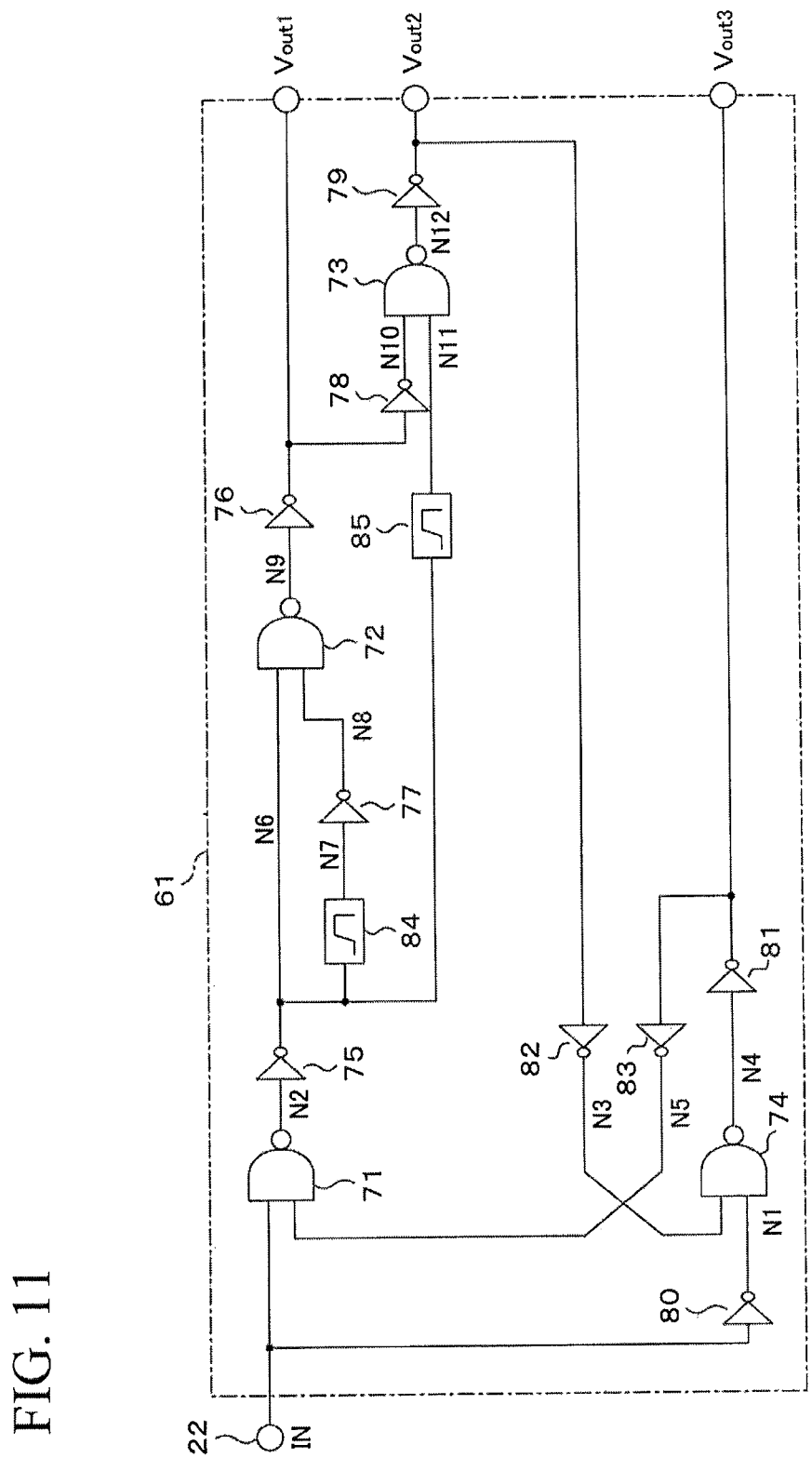
FIG. 11 is a diagram illustrating a specific example of a circuit of a driving signal generator of the driving circuit of the schottky type transistor according to the third embodiment.
Figure 12:
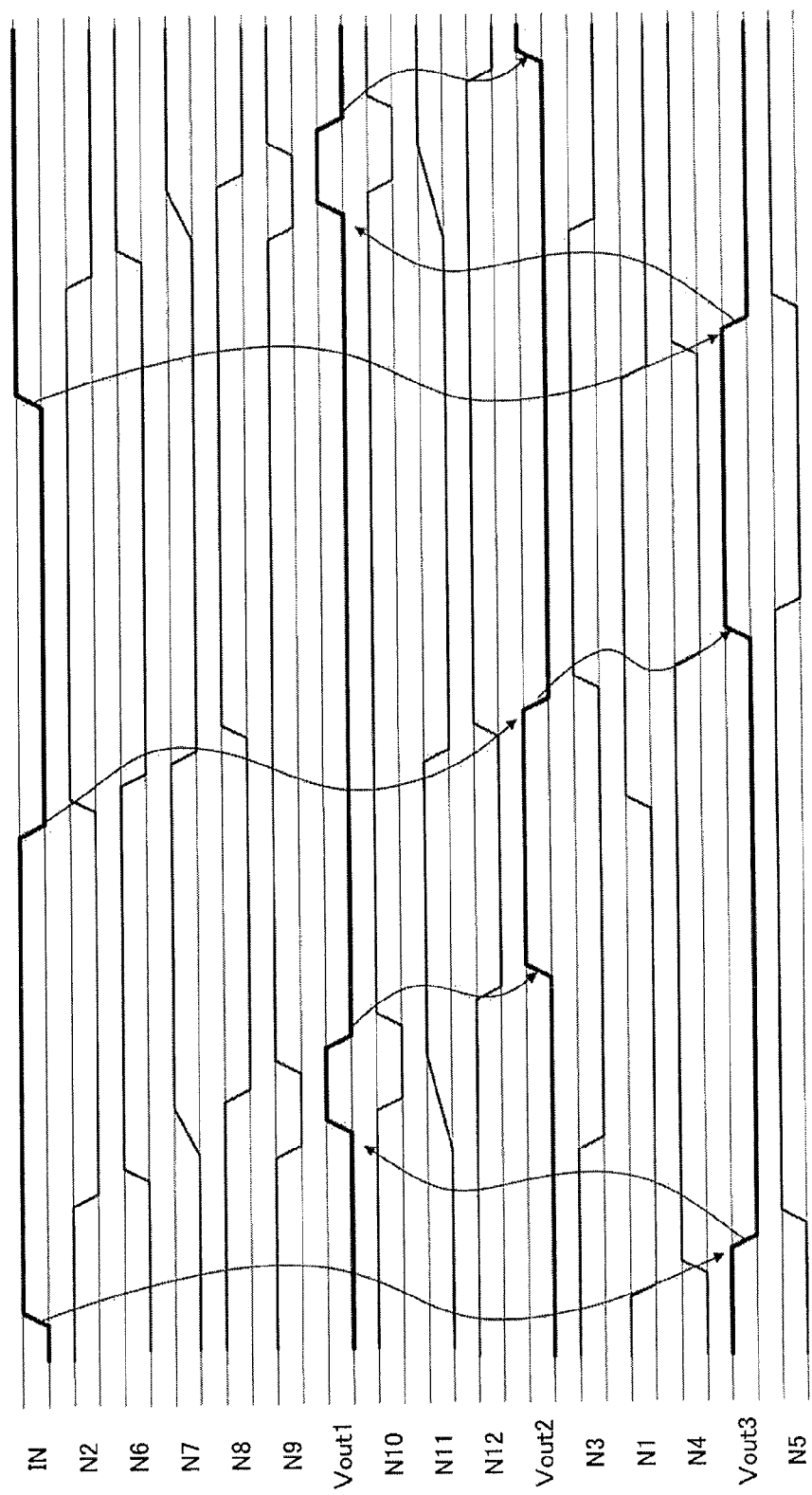
FIG. 12 is a timing chart illustrating operation of the driving signal generator.

FIG. 11 is a diagram illustrating a specific example of a circuit of the driving signal generator 61, and FIG. 12 is a timing chart illustrating operation of the driving signal generator 61.

As illustrated in FIG. 11, the driving signal generator 61 is formed by NAND circuits 71 to 74, inverters 75 to 83, and delay elements 84, 85.

As illustrated in FIG. 12, when the signal IN is inputted, the driving signal generator 61 outputs the first driving signal Vout1 and the second driving signal Vout2 in sequence. A period of time between the rising and falling edges of the first driving signal Vout1 is set by the delay element 84; the first driving signal Vout1 falls and then the second driving signal Vout2 rises. The delay element 85 is provided in order to prevent the first driving signal Vout1 and the second driving signal Vout2 from being outputted at the same time (or becoming "1" at the same time).

Also, the third driving signal Vout3 becomes "1" when the voltage applied to the input terminal 22 is lower than a threshold voltage, while the third driving signal Vout3 becomes "0" when the applied voltage is higher than the threshold voltage.

Operation of the driving circuit 60 according to the third embodiment will be described below with reference to FIG. 10.

When the signal IN is inputted to the input terminal 22, the driving signal generator 61 outputs the first driving signal Vout1 and the third driving signal Vout3 thereby to turn on the MOS transistor 62 and turn off the MOS transistor 63. Thereby, a current flows from the high-potential power supply line Vdd1 through the MOS transistor 62 and the node N1 to the gate of the GaN transistor 21, thus increasing the gate voltage of the GaN transistor 21.

Then, when the gate voltage exceeds the threshold voltage (e.g. 1 to 2 V) of the GaN transistor 21, the GaN transistor 21 is turned on. In this case, the MOS transistor 62 is in on-state, and thus, resistance is low in the path from the power supply line Vdd1 to the GaN transistor 21, the GaN transistor 21 is turned on substantially simultaneously with the rising of the signal IN, and there is little delay in the switching operation.

Then, after a lapse of the period of time set by the delay element 84, the first driving signal Vout1 becomes "0," and the second driving signal Vout2 becomes "1." Thereby, the MOS transistor 62 is turned off, and the MOS transistor 64 is turned on. Then, a current flows from the high-potential power supply line Vdd2 through the resistance R1 and the MOS transistor 64 to the gate of the GaN transistor 21, thus causing a further increase in the gate voltage of the GaN transistor 21.

When the gate voltage of the GaN transistor 21 reaches the breakdown voltage, the GaN transistor 21 undergoes a breakdown. However, as described with reference to FIG. 3, when the GaN transistor 21 undergoes the breakdown, a large current flows through the resistance R1, and the gate voltage of the GaN transistor 21 decreases by the voltage drop effected by the resistance R1, so that the breakdown is suppressed.

As a result, the drive capability to drive the GaN transistor 21 may be fully drawn out irrespective of variations in the breakdown voltage of the GaN transistor 21.

Meanwhile, when the voltage applied to the input terminal 22 becomes 0 V, both the first driving signal Vout1 and the second driving signal Vout2 become "0," and the third driving signal Vout3 becomes "1." Thereby, the MOS transistors 62, 64 are turned off and the MOS transistor 63 is turned on, and thus, the gate voltage of the GaN transistor 21 becomes equal to the voltage (0 V) of the low-potential power supply line Vss, and the GaN transistor 21 is turned off.

Also in the third embodiment, the drive capability to drive the GaN transistor 21 may be fully drawn out irrespective of variations in the breakdown voltage, as is the case with the first embodiment.

Other Embodiments

In the above-described first, second or third embodiment, elements such as the MOS transistors, the diode or diodes and the resistance which form the driving circuit 30, 50 or 60 may be formed on a silicon substrate to yield a chip. These elements may also be implemented in chip form and provided externally to the GaN transistor.

Also, the silicon substrate is available for fabrication of the GaN transistor as described previously, and thus, the GaN transistor and the elements such as the MOS transistors, the diode or diodes and the resistance may be formed on the same silicon substrate to yield a chip. In this case, reductions in a parts count and costs for electronic equipment using the GaN transistor may be achieved, and the effect of reducing parasitic impedance or reducing ringing at the time of switching may also be expected since a distance between the elements may be reduced.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A driving method of a schottky type transistor, the driving method comprising:
   supplying a lower voltage than a breakdown voltage of the schottky type transistor to a gate of the schottky type transistor, at the time of rising of an input signal; and
   thereafter supplying a higher voltage than the breakdown voltage to a resistance connected to the gate of the schottky type transistor.

2. The driving method of the schottky type transistor, according to claim 1, wherein the schottky type transistor is a GaN transistor.

3. The driving method of the schottky type transistor, according to claim 1, wherein a resistance value R1 of the resistance is set equal to or more than a value given by an equation: $R1=(V_{G1}-V_{G2})/I_G$, where $V_{G1}$ denotes a maximum value of the voltage supplied to the resistance; $V_{G2}$ denotes the breakdown voltage of the schottky type transistor; and $I_G$ denotes a current fed via the resistance through the gate of the schottky type transistor at the occurrence of a breakdown.

4. A driving circuit of a schottky type transistor, the driving circuit comprising:
   an input terminal supplied with an input signal;
   an output terminal connected to a gate of the schottky type transistor; and
   an electronic circuit provided between the input terminal and the output terminal,
   wherein the electronic circuit outputs a first voltage lower than a breakdown voltage of the schottky type transistor to the output terminal at the time of rising of the input signal, and thereafter supplies a second voltage higher than the breakdown voltage to a resistance connected to the output terminal.

5. The driving circuit of the schottky type transistor, according to claim 4, wherein a resistance value R1 of the resistance is set equal to or more than a value given by an equation: $R1=(V_{G1}-V_{G2})/I_G$, where $V_{G1}$ denotes a maximum value of the voltage supplied to the resistance; $V_{G2}$ denotes the breakdown voltage of the schottky type transistor; and $I_G$ denotes a current fed via the resistance through the gate of the schottky type transistor at the occurrence of a breakdown.

6. The driving circuit of the schottky type transistor, according to claim 4,
   wherein the electronic circuit includes
      a diode having an anode connected to a first power supply line supplied with a lower voltage than the breakdown voltage of the schottky type transistor, and having a cathode connected to a first node, and
      a switching element connected between the first node and a second node, and configured to be turned on or off according to the input signal,
   the resistance is connected between the first node and a second power supply line supplied with a higher voltage than the breakdown voltage of the schottky type transistor, and
   the second node is connected to the output terminal.

7. The driving circuit of the schottky type transistor, according to claim 4,
   wherein the electronic circuit includes
      a first node supplied with a voltage according to the input signal,
      a switching element and a first diode connected in series between a second node and a power supply line supplied with a lower voltage than the breakdown voltage of the schottky type transistor, and
      a second diode and the resistance connected in series between the first node and the second node,
   the second node is connected to the output terminal, and
   the switching element is turned on or off according to the input signal.

8. The driving circuit of the schottky type transistor, according to claim 4,
   wherein the electronic circuit includes
      a driving signal generator configured to output a first driving signal and a second driving signal in order according to a voltage of the input signal,
      a first switching element connected between the output terminal and a first power supply line supplied with a lower voltage than the breakdown voltage of the schottky type transistor, and configured to be turned on or off by the first driving signal, and
      a second switching element connected between the output terminal and a second power supply line supplied with a higher voltage than the breakdown voltage of the schottky type transistor, and configured to be turned on or off by the second driving signal, and
   the resistance is connected between the second power supply line and the second switching element or between the second switching element and the output terminal.

9. A schottky type transistor circuit comprising:
   a schottky type transistor; and
   a driving circuit connected to the schottky type transistor,
   wherein the driving circuit supplies a first voltage lower than a breakdown voltage of the schottky type transistor to a gate of the schottky type transistor at the time of rising of an input signal, and thereafter supplies a second voltage higher than the breakdown voltage to a resistance connected to the gate of the schottky type transistor.

10. The schottky type transistor circuit according to claim 9, wherein the schottky type transistor is a GaN transistor.

11. The schottky type transistor circuit according to claim 9, wherein a resistance value R1 of the resistance is set equal to or more than a value given by an equation: $R1=(V_{G1}-V_{G2})/I_G$, where $V_{G1}$ denotes a maximum value of the voltage supplied to the resistance; $V_{G2}$ denotes the breakdown voltage of the schottky type transistor; and $I_G$ denotes a current fed via the resistance through the gate of the schottky type transistor at the occurrence of a breakdown.

12. The schottky type transistor circuit according to claim 9,
   wherein the driving circuit includes
      a diode having an anode connected to a first power supply line supplied with a lower voltage than the breakdown voltage of the schottky type transistor, and having a cathode connected to a first node, and
      a switching element connected between the first node and a second node, and configured to be turned on or off according to the input signal,
   the resistance is connected between the first node and a second power supply line supplied with a higher voltage than the breakdown voltage of the schottky type transistor, and
   the second node is connected to the gate of the schottky type transistor.

13. The schottky type transistor circuit according to claim 9,
   wherein the driving circuit includes
      a first node supplied with a voltage according to the input signal, a switching element and a first diode connected in series between a power supply line supplied with a lower voltage than the breakdown voltage of the schottky type transistor and a second node, and a second diode and the resistance connected in series between the first node and the second node, the second node is connected to the gate of the schottky type transistor, and the switching element is turned on or off according to the input signal.

14. The schottky type transistor circuit according to claim 9, wherein the driving circuit includes a driving signal generator configured to output a first driving signal and a second driving signal in order according to a voltage of the input signal, a first switching element connected between the gate of the schottky type transistor and a first power supply line supplied with a lower voltage than the breakdown voltage of the schottky type transistor, and configured to be turned on or off by the first driving signal, and a second switching element connected between the gate of the schottky type transistor and a second power supply line supplied with a higher voltage than the breakdown voltage of the schottky type transistor, and configured to be turned on or off by the second driving signal, and the resistance is connected between the second power supply line and the second switching element or between the second switching element and the output terminal.

* * * * *